United States Patent
Doris et al.

(10) Patent No.: US 9,041,116 B2
(45) Date of Patent: May 26, 2015

(54) STRUCTURE AND METHOD TO MODULATE THRESHOLD VOLTAGE FOR HIGH-K METAL GATE FIELD EFFECT TRANSISTORS (FETS)

(75) Inventors: Bruce B. Doris, Brewster, NY (US); Kangguo Cheng, Guilderland, NY (US); Steven J. Holmes, Guilderland, NY (US); Ali Khakifirooz, Slingerlands, NY (US); Pranita Kulkarni, Slingerlands, NY (US); Shom Ponoth, Clifton Park, NY (US); Raghavasimhan Sreenivasan, Schenectady, NY (US); Stefan Schmitz, Ballston Spa, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/478,154

(22) Filed: May 23, 2012

(65) Prior Publication Data

US 2013/0313643 A1   Nov. 28, 2013

(51) Int. Cl.
*H01L 27/092* (2006.01)
*H01L 27/12* (2006.01)
*H01L 21/8238* (2006.01)

(52) U.S. Cl.
CPC H01L 21/823835 (2013.01); H01L 21/823842 (2013.01)

(58) Field of Classification Search
CPC ............ H01L 29/66795; H01L 29/785; H01L 21/845; H01L 21/823431; H01L 21/823821; H01L 27/1211; H01L 27/10826; H01L 27/10879; H01L 29/7846; H01L 21/823842; H01L 21/823871; H01L 27/092; H01L 27/0922; H01L 21/823835
USPC ......... 257/310, 508, 506, 369, 388, 412, 347, 257/E27.062, E27.112, E21.639; 438/199, 438/218, 217
See application file for complete search history.

(56) References Cited

U.S. PATENT DOCUMENTS

| 4,731,605 | A | 3/1988 | Nixon |
| 6,114,082 | A | 9/2000 | Hakey et al. |

(Continued)

FOREIGN PATENT DOCUMENTS

| CA | 1204547 | 5/1986 | |
| EP | 614226 A1 * | 9/1994 | ............. H01L 29/62 |
| JP | 1-293339 | 11/1989 | |

OTHER PUBLICATIONS

Office Action dated Oct. 31, 2014 received in U.S. Appl. No. 13/788,689.

*Primary Examiner* — Khiem D Nguyen
*Assistant Examiner* — Pauline Vu
(74) *Attorney, Agent, or Firm* — Scully, Scott, Murphy & Presser, P.C.; H. Daniel Schnurmann (57) ABSTRACT

A method for forming an electrical device that includes forming a high-k gate dielectric layer over a semiconductor substrate that is patterned to separate a first portion of the high-k gate dielectric layer that is present on a first conductivity device region from a second portion of the high-k gate dielectric layer that is present on a second conductivity device region. A connecting gate conductor is formed on the first portion and the second portion of the high-k gate dielectric layer. The connecting gate conductor extends from the first conductivity device region over the isolation region to the second conductivity device region. One of the first conductivity device region and the second conductivity device region may then be exposed to an oxygen containing atmosphere. Exposure with the oxygen containing atmosphere modifies a threshold voltage of the semiconductor device that is exposed.

10 Claims, 7 Drawing Sheets

(56) References Cited

U.S. PATENT DOCUMENTS

| | | |
|---|---|---|
| 6,372,412 B1 | 4/2002 | Hakey et al. |
| 6,670,226 B2 * | 12/2003 | Lin et al. .................. 438/199 |
| 7,432,567 B2 * | 10/2008 | Doris et al. ............... 257/407 |
| 7,442,988 B2 * | 10/2008 | Oh et al. ................... 257/321 |
| 7,445,981 B1 * | 11/2008 | Karve et al. .............. 438/199 |
| 7,488,656 B2 | 2/2009 | Cartier et al. |
| 7,576,395 B2 * | 8/2009 | Jung et al. ................ 257/351 |
| 7,625,790 B2 * | 12/2009 | Yang .......................... 438/198 |
| 7,659,157 B2 * | 2/2010 | Greene et al. ............ 438/199 |
| 7,666,730 B2 * | 2/2010 | Karve et al. .............. 438/199 |
| 7,851,299 B2 * | 12/2010 | Natzle ....................... 438/230 |
| 7,932,150 B2 | 4/2011 | Watanabe et al. |
| 8,018,005 B2 * | 9/2011 | Doris et al. ............... 257/369 |
| 8,030,709 B2 * | 10/2011 | Adams et al. ............. 257/369 |
| 8,158,481 B2 * | 4/2012 | Chen et al. ................ 438/275 |
| 8,174,073 B2 * | 5/2012 | Lee et al. .................. 257/347 |
| 8,183,644 B1 * | 5/2012 | Chuang et al. ............ 257/388 |
| 8,785,281 B2 * | 7/2014 | Chen et al. ................ 438/275 |
| 2006/0094255 A1 | 5/2006 | Sekine et al. |
| 2007/0284671 A1 * | 12/2007 | Tsutsumi et al. .......... 257/369 |
| 2008/0064159 A1 * | 3/2008 | Ashida ....................... 438/201 |
| 2008/0128825 A1 * | 6/2008 | Sato et al. ................. 257/369 |
| 2008/0157215 A1 * | 7/2008 | Miyashita ................. 257/374 |
| 2008/0179687 A1 * | 7/2008 | Sato ........................... 257/369 |
| 2008/0242070 A1 * | 10/2008 | Chen et al. ................ 438/587 |
| 2008/0283958 A1 * | 11/2008 | Ohnuma ..................... 257/506 |
| 2009/0152650 A1 * | 6/2009 | Chudzik et al. ........... 257/410 |
| 2009/0283830 A1 * | 11/2009 | Callegari et al. .......... 257/351 |
| 2010/0059827 A1 * | 3/2010 | Oosuka et al. ............. 257/369 |
| 2010/0181624 A1 * | 7/2010 | Takahashi .................. 257/369 |
| 2010/0237424 A1 * | 9/2010 | Cheng et al. .............. 257/369 |
| 2010/0317181 A1 * | 12/2010 | Chung et al. .............. 438/585 |
| 2011/0309333 A1 * | 12/2011 | Cheng et al. ................ 257/24 |
| 2012/0112287 A1 * | 5/2012 | Anderson et al. ......... 257/368 |
| 2012/0199813 A1 * | 8/2012 | Datta et al. .................. 257/20 |
| 2013/0126976 A1 * | 5/2013 | Yu et al. .................... 257/369 |

* cited by examiner

FIG. 10

STRUCTURE AND METHOD TO MODULATE THRESHOLD VOLTAGE FOR HIGH-K METAL GATE FIELD EFFECT TRANSISTORS (FETS)

BACKGROUND

The present disclosure relates to threshold voltage shifts in semiconductor devices.

For more than three decades, the continued miniaturization of silicon metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

In one embodiment, a method is provided for forming an electrical device that includes forming a first conductivity device region and a second conductivity device region in a semiconductor substrate. A high-k gate dielectric layer is formed over the semiconductor substrate and is patterned to separate a first portion of the high-k gate dielectric layer that is present on the first conductivity device region from a second portion of the high-k gate dielectric layer that is present on the second conductivity device region. A connecting gate conductor is formed on the first portion and the second portion of the high-k gate dielectric layer. The connecting gate conductor extends from the first conductivity device region over an isolation region to the second conductivity device region. One of the first conductivity device region or the second conductivity device region may then be exposed to an oxygen containing atmosphere, while the other of the first conductivity device region or the second conductivity device region is not exposed to the oxygen containing atmosphere. Exposure to one of the first conductivity device region and the second conductivity device region with the oxygen containing atmosphere modifies a threshold voltage of the semiconductor device contained therein.

In another aspect of the disclosure, an electrical device is provided that includes a semiconductor substrate including a first device region and a second device region that are separated by an isolation region. A first gate stack is present in the first device region comprised of at least a first portion of a high-k gate dielectric layer and a first portion of a metal nitride layer. A first source region and a first drain region is present in the first device region on opposing sides of the first gate stack. The first gate stack extends from the first device region onto the isolation region. A second gate stack is present in the second device region that is comprised of at least a second portion of a high-k gate dielectric layer and a second portion of a metal nitride layer. A second source region and a second drain region is present in the second device region on opposing sides of the second gate stack. The second gate stack extends from the second device region onto the isolation region, and is separated from the first gate stack. A connecting gate conductor extends from the first gate stack over the isolation region to the second gate stack.

In yet another aspect of the disclosure, an electrical device is provided that includes a first fin structure present on a first portion of a substrate and a second fin structure present on a second portion of the substrate. A first gate stack contacts a first channel portion of the first fin structure. The first gate stack is comprised of at least a first portion of a high-k gate dielectric layer and a first portion of a metal nitride layer. A first source region and a first drain region are present on opposing sides of the first gate stack. The first gate stack extends from the first fin structure onto a first portion of the substrate between the first fin structure and the second fin structure. A second gate stack is present contacting a second channel portion of the second fin structure. The second gate stack is comprised of at least a second portion of a high-k gate dielectric layer and a second portion of a metal nitride layer. A second source region and a second drain region are present on opposing sides of the second gate stack. The second gate stack extends from the second fin structure onto a portion of the substrate between the first fin structure and the second fin structure. The second gate stack is separated from the first gate stack. A connecting gate conductor extends from the first gate stack to the second gate stack.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the present disclosure are described herein; however, it is to be understood that the disclosed embodiments are merely illustrative of the structures and methods disclosed herein. In addition, each of the examples given in connection with the various embodiments of the disclosure is intended to be illustrative, and not restrictive. Further, the figures are not necessarily to scale, some features may be exaggerated to show details of particular components. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower" "vertical", "horizontal", "top", "bottom", and derivatives thereof shall relate to the structures disclosed herein, as they are oriented in the drawing figures.

In one embodiment, the present disclosure is related to controlling the incidence of threshold voltage shift in semiconductor devices including high-k dielectric materials. It has been determined that a high-k dielectric material can absorb and conduct oxygen. This is especially problematic for gate first processing where the high-k dielectric is potentially subjected to many processing steps containing oxygen ($O_2$). When oxygen comes into contact with the high-k gate dielectric of a p-type semiconductor device, it typically shifts the p-type semiconductor device's threshold voltage lower, and if the oxygen comes into contact with the high k gate dielectric of the n-type semiconductor device it typically shifts the n-type semiconductor device's threshold voltage higher. As used herein, "threshold voltage (Vt)" is the lowest attainable gate voltage that will turn on a semiconductor device, e.g., FET or finFET, by making the channel region of the device conductive.

In some embodiments, the presence of unwanted oxygen has been identified in substantially all of the oxygen containing steps for manufacturing semiconductor devices. In some embodiments, the methods and structures disclosed herein uses oxygen in a selected manner to modulate the threshold voltage of selected semiconductor devices without impacting the threshold voltage for all of the semiconductor devices. For example, in some embodiments, the methods and structures disclosed herein may allow for oxygen to reduce the threshold voltage of p-type semiconductor devices, e.g., pFETs or p-type finFETs, without impacting the threshold voltage of n-type semiconductor devices, e.g., nFETs or n-type finFETs.

In some circuits, the entirety of the gate stack connects from one semiconductor device, e.g., nFET, to a second semiconductor device, e.g., pFET, and bridges over a shallow trench isolation region. In some embodiments, the methods and structures disclosed herein section the high-k gate dielectric, thereby separating the high-k gate dielectric in the n-type semiconductor device region from the high-k gate dielectric that is present in the p-type semiconductor device region. The separation of the high-k gate dielectrics in the n-type and p-type semiconductor device regions substantially eliminates oxygen traveling from one of the n-type and p-type semiconductor devices to the other of the n-type and p-type semiconductor devices. The fact that the high-k gate dielectric for the n-type semiconductor device is separated from the high-k gate dielectric for the p-type semiconductor device means that one of the p-type or n-type semiconductor devices may be treated with oxygen to effectuate a threshold voltage shift, while the other of the p-type or n-type semiconductor device remains unmodified.

FIGS. 1-7 depict one embodiment of forming an electrical device including planar semiconductor devices, in which the work function of at least one of the planar semiconductor devices is adjusted by exposure to an oxygen containing atmosphere and at least one of the planar semiconductor devices are protected from being exposed to an oxygen containing atmosphere. The term "planar semiconductor device" as used herein refers to a semiconductor device that has a gate structure formed on a planar upper surface of a semiconductor substrate, in which the source region and drain region are formed in or on the planar upper surface of the semiconductor substrate on opposing sides of the gate structure. As used herein, the term "semiconductor device" means an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. Although the semiconductor devices that are formed in the process sequence depicted in FIGS. 1-7 are field effect transistors (FET), the present disclosure is not limited to only this type of planar semiconductor device. For example, the present disclosure is suitable for use with any semiconductor device that may experience a threshold voltage shift when exposed to oxygen.

Figure 1:
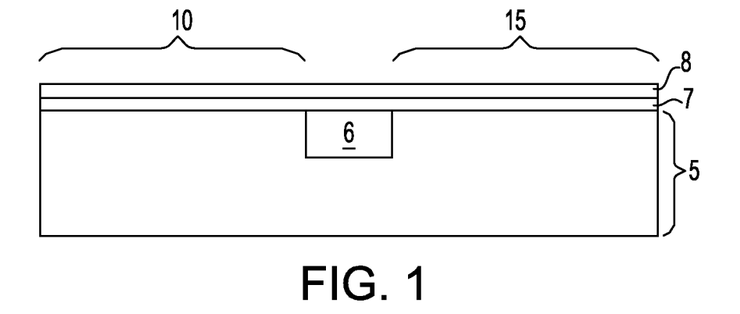
FIG. 1 is a side cross-sectional view depicting forming a first conductivity device region and a second conductivity device region in a semiconductor substrate and forming a high-k gate dielectric layer and a metal nitride layer over the semiconductor substrate for one embodiment of a method of forming an electrical device including planar semiconductor devices in accordance with the present disclosure.

FIG. 1 depicts one embodiment of forming a first conductivity device region 10 and a second conductivity device region 15 in a semiconductor substrate 5 and forming a high-k gate dielectric layer 7 and a metal nitride layer 8 over the semiconductor substrate 5. The semiconductor substrate 5 may be any silicon-containing substrate including, but not limited to, Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. The semiconductor substrate 5 may also be composed of compound semiconductor materials, such as type III-V semiconductor.

In one embodiment, the semiconductor substrate 5 includes an isolation region 6 for separating device regions of different conductivities, e.g., the first conductivity device region 10 and the second conductivity device region 15. As used herein, the term "conductivity type" denotes a semiconductor device being p-type or n-type. In one embodiment, the first conductivity device region may be processed to provide an n-type semiconductor device, and the second conductivity device region may be processed to provide a p-type semiconductor device. In one embodiment, the isolation region 6 can be provided by forming a trench in the semiconductor substrate 5 utilizing a dry etching process, such as reactive-ion etching (RIE) or plasma etching, and then filling the trench with an insulating material, such as an oxide. In one embodiment, the trench may be filled using a deposition method, such as chemical vapor deposition (CVD). The first conductivity device region 10 and the second conductivity device region 15 may each include a well region. In one embodiment, when the first conductivity device region 10 is processed to provide a n-type semiconductor device, the well region that is present in the first conductivity device region 10 is doped to a p-type conductivity, and when the second conductivity device region 15 is processed to provide a p-type semiconductor device, the well region that is present in the second conductivity device region 15 is doped to an n-type conductivity. It is noted that the conductivity type for the first conductivity device region 10 and the second conductivity device region 15 may be switched. For example, although the examples included herein refer to the semiconductor device that is formed in the first conductivity device region 10 as an n-type semiconductor device and refer to the semiconductor device that is formed in the second conductivity device region 15 as a p-type semiconductor device, the first conductivity device region 10 may also be processed to provide a p-type semiconductor device and the second conductivity device region 15 may be processed to provide an n-type semiconductor device.

Still referring to FIG. 1, the high-k gate dielectric layer 7 may be composed of a dielectric material having a dielectric constant that is greater than 7. A "high-k dielectric material" is a dielectric material having a dielectric constant at room temperature, e.g., 20° C. to 25° C., which is greater than the dielectric constant of silicon oxide ($SiO_2$). For example, a high-k dielectric material may be a material having a dielectric constant that is greater than the 10, e.g., 10.1. In another embodiment, the high-k gate dielectric layer 7 is comprised of a material having a dielectric constant greater than 15.0. In yet another embodiment, the high-k gate dielectric layer 7 is comprised of a material having a dielectric constant ranging from 10 to 30. Some examples of high-k dielectric materials suitable for the high-k gate dielectric layer 7 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the high-k gate dielectric layer 7 is hafnium oxide ($HfO_2$).

In one embodiment, the high-k gate dielectric layer 7 is formed on the semiconductor substrate 15 using a deposition method. The terms "formed on", "present on" and "overlying" as used herein mean that an intermediate structure may be present between the structures being formed or described. For example, an interfacial oxide may be present between the high-k gate dielectric layer 7 and the semiconductor substrate 5. The term "direct contact" denotes that the structures being described are in direct contact with each other without an intermediate structures present therebetween. In one embodiment, the high-k gate dielectric layer 7 can be formed using a deposition process, such as chemical vapor deposition (CVD). Variations of chemical vapor deposition (CVD) processes for depositing the layer of the high-k dielectric material include, but are not limited to, Atmospheric Pressure CVD (APCVD), Low Pressure CVD (LPCVD) and Plasma Enhanced CVD (PECVD), Metal-Organic CVD (MOCVD) and others. In another embodiment, the high-k gate dielectric layer 7 may be formed by a thermal growth process such as, for example, oxidation, nitridation or oxynitridation. The high-k gate dielectric layer 7 has a thickness as measured from the upper surface of the semiconductor substrate 5 that ranges from 0.5 nm to 10 nm. In another embodiment, the high-k gate dielectric layer 7 has a thickness as measured from the upper surface of the semiconductor substrate 5 that ranges from 1 nm to 5 nm.

Still referring to FIG. 1, a metal nitride layer 8 may then be formed on an upper surface of the high-k gate dielectric layer 7. In some embodiments, the metal nitride layer 8 may be in direct contact with the high-k gate dielectric layer 7. The metal nitride layer 8 that is present on the high-k gate dielectric layer 7 may be composed of titanium nitride (TiN), tantalum nitride (TaN), tantalum silicon nitride (TaSiN), aluminum nitride (AlN), titanium aluminum nitride (TiAlN), tungsten nitride (WN) or a combination thereof. The above examples of compositions for the metal nitride layer 8 are provided for illustrative purposes only, and are not intended to limit the present disclosure, as other compositions includes at least a metal and nitrogen are equally suitable for the metal nitride layer 8. In some embodiments, the composition of the metal nitride layer 8 provides a work function shift that is suitable for an n-type or p-type semiconductor device. For example, in one embodiment, the metal nitride layer 8 is titanium nitride, the metal nitride layer may provide a work function shift that is suitable for n-type semiconductor devices. In another example, the metal nitride layer 8 is an aluminum containing nitride, which may provide a work function shift that is suitable for p-type semiconductor devices.

The metal nitride layer 8 may be deposited using a physical vapor deposition (PVD) method, such as sputtering. In one embodiment, the sputtering deposition process for forming the metal nitride layer 8 includes applying high-energy particles to strike a solid slab of a metal target material to provide the metal constituent of the metal nitride layer 8, such as tantalum, titanium, tungsten or a combination thereof. The high-energy particles physically dislodge metal atoms of target material, which are then deposited on the high-k gate dielectric layer 7. The source of nitrogen for the metal nitride layer 8 may be provided by nitrogen gas (N$_2$). The nitrogen source may be introduced to the sputtering chamber as the sputtered atoms of the metal constituent of the metal nitride layer 8 are migrating towards the deposition surface. In one embodiment, the metal nitride layer 8 may have a thickness ranging from 25 Å to 200 Å. In another embodiment, the metal nitride layer 8 has a thickness ranging from 50 Å to 100 Å.

Figure 2A:
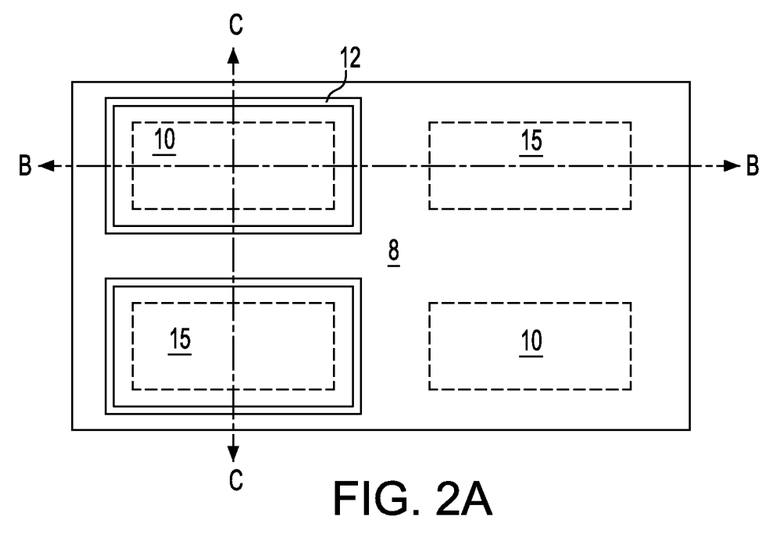
FIG. 2A is a top down planar view depicting patterning the high-k gate dielectric layer and the metal nitride layer to separate a first portion of the high-k gate dielectric layer and the metal nitride layer that is present in the first conductivity device region from a second portion of the high-k gate dielectric layer and the metal nitride layer that is present in the second conductivity device region, in accordance with one embodiment of the present disclosure.
Figure 2B:
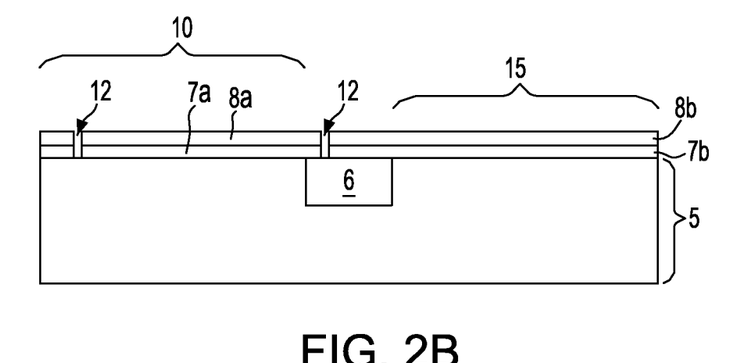
FIG. 2B is a side cross-sectional view along section line B-B in FIG. 2A.

FIGS. 2A and 2b depict patterning the high-k gate dielectric layer 7 and the metal nitride layer 8 to separate a first portion of the high-k gate dielectric layer 7a and the metal nitride layer 8a that is present in the first conductivity device region 10 from a second portion of the high-k gate dielectric layer 7b and the metal nitride layer 8b that is present in the second conductivity device region 15. In one embodiment, patterning the high-k gate dielectric layer 7 and the metal nitrate layer 8 to separate the first portion of the high-k gate dielectric layer 7a and the metal nitride layer 8a that is present on the first conductivity device region 10 from a second portion of the high-k gate dielectric layer 7b and the metal nitride layer 8b that is present on the second conductivity device region 15 comprises anisotropic etching and a combination of a hybrid photoresist layer and one of a positive or negative mask. In some embodiments, a hardmask may be formed on the upper surface of the metal nitride layer 8 prior to patterning. The hardmask may be composed of a nitride, such as silicon nitride, but other dielectric materials such as oxides are also suitable for the composition of the hardmask. The hardmask may be deposited, e.g., by chemical vapor deposition (CVD) or spin on deposition, and may have a thickness that is suitable for selective etching with the underlying materials.

The hybrid photoresist layer is typically formulated using components of existing positive and negative tone resists. This includes, for example, poly(hydroxystyrene) resins which are partially modified with acid-sensitive solubility dissolution inhibiting functionalities, a cross-linker, a photoacid generator, and, optionally, a base additive and a photosensitizer. The photoresist resins suitable for use in accordance with the present disclosure include any of the base-soluble, long chain polymers suitable for use as a polymer resin in a photoresist formulation. Specific examples include: (i) aromatic polymers having an —OH group, e.g., polyhydroxystyrenes, such as poly (4-hydroxystyrene), poly (3-hydroxystyrene), commercially available from Hoechst Celanese of Corpus Christi, Tex., novolak resins commercially available from Shipley of Marlboro, Mass., and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form, i.e., once the positive tone reaction has occurred, is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. In some embodiments, the polymer resins have an average molecular weight within the range of 1,000 daltons to 250,000 daltons, and in one example within the range of 1,000 to 25,000 daltons, to enhance its solubility in developer solutions. Examples include p-hydroxystyrene-maleic acid anhydride copolymers, polyhydroxystyrene-p-tertiarybutyl-carganatostyrene co-polymers, poly(2-hydroxystyrene), phenolformaldehyde resins, polymethyl methacrylate-tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. In one embodiment, the PHM-C includes both poly (hydroxystyrene) subunits and vinyl cyclohexanol subunits being in the range of 99:1 to 50:50.

Crosslinking compositions may include tetramethoxymethyl glycouril ("Powderlink") and 2,6-bis(hydroxymethyl)-p-cresol. However, other possible crosslinking compositions include:

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycol-urils, for example of the formula:

as can be found in Canadian Patent No. 1 204 547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxynaphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

The casting solvent is used to provide proper consistency to the entire composition so that it may be applied to the substrate surface without the layer being too thick or too thin. Sample casting solvents include: ethoxyethylpropionate ("EEP"), a combination of EEP and .gamma.-butyrolactone ("GBL"), and propyleneglycolmonoethylether acetate (PM acetate).

The hybrid photoresist may be formed on the upper surface of the first and second portions of the metal nitride layer 8a, 8b, or the upper surface of the optional hard mask (not shown), using a deposition process. Examples of deposition processes that are suitable for forming the hybrid resist include spin-on coating, dip coating, chemical vapor deposition, brushing, evaporation and other like deposition techniques. Further, details regarding the hybrid resist may be found in U.S. Pat. No. 6,114,082, which is assigned to International Business Machines.

Following deposition, the hybrid photoresist may be patterned with radiation using a positive or negative mask. By "patterned" it is meant that the layer of photoresist is selectively irradiated to light through a stencil, e.g., reticle or mask, that is designed to allow light to fall only on preselected areas of the layer of the photoresist. The light causes a chemical change, e.g., cross-linking, in the layer of photoresist. The stencil (hereafter referred to as a reticle) may include a transparent substrate and a pattern layer. The radiant energy blocking portion may be comprised of chrome, chrome oxide, chromium nitride, iron oxide, silicon or a number of other opaque materials.

The radiation, i.e., light, that may be used to expose the layer of hybrid photoresist through the reticle may include UV, DUV, and the H and I lines of a mercury-vapor lamp. In another embodiment, the layer of photoresist may be exposed with an ion beam. The exposed portion of the layer of hybrid photoresist may be washed away, i.e., removed, using a developer. Examples of developers for use with hybrid photoresist include sodium hydroxide (NaOH) and tetramethyl ammonium hydroxide (TMAH) to be used in combination with a water rinse ($H_2O$). Other examples of developers for use with the hybrid photoresist include xylene with a rinse composed of n-Butylacetate.

Figure 3:
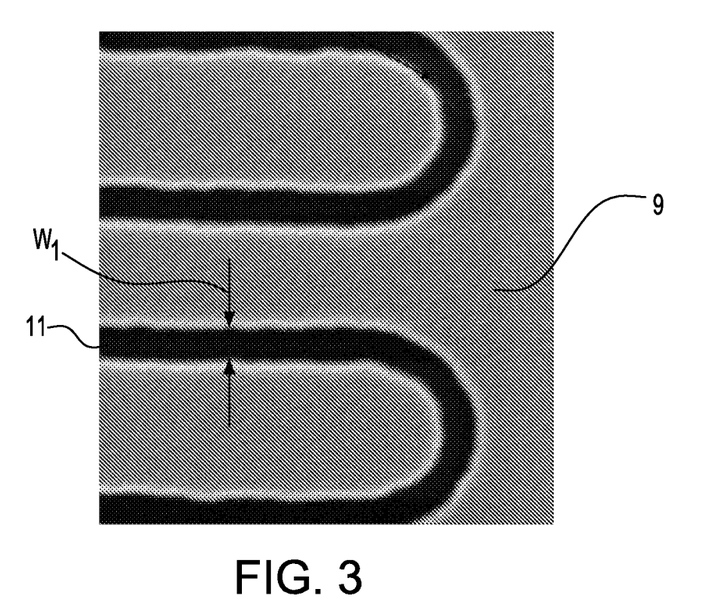
FIG. 3 is a micrograph of one embodiment of a photo resist mask for pattering the structures depicted in FIGS. 2A and 2B, in accordance with of the present disclosure.

FIG. 3 depicts one embodiment of a hybrid photoresist 9 that has been patterned with a positive or negative photomask and developed. The patterned photoresist includes an opening 11 (hereafter referred to as "hybrid space") that is self aligned to the edges of the positive or negative photomask, and has a narrow width W1. In one embodiment, the width W1 of the hybrid space 11 ranges from 25 nm to 60 nm. In another embodiment, the width W1 of the hybrid space 11 ranges from 30 nm to 55 nm. In yet another embodiment, the width W1 of the hybrid space 11 ranges from 45 nm to 50 nm. In one embodiment, patterning the hybrid photoresist 9 with a positive or negative mask provides a hybrid space 11 that provides the opening of an etch mask.

Referring to FIGS. 2A and 2B, and in some embodiments, following patterning and development of the hybrid photoresist, the hybrid photoresist is employed as an etch mask in combination with an anisotropic etch process, in which the openings, i.e., hybrid spaces, present therethrough dictate the portions of the underlying metal nitride layer 8a, 8b, high-k gate dielectric layer 7a, 7b, or optional hard mask layer, are removed by the anisotropic etch. The portions of the metal nitride layer 8a, 8b and the high-k gate dielectric layer 7a, 7b that are removed using the patterned hybrid photoresist provide the separation between the first portion of the high-k gate dielectric layer 7a and the metal nitride layer 8a that is present in the first conductivity device region 10 from a second portion of the high-k gate dielectric layer 7b and the metal nitride layer 8b that is present in the second conductivity device region 15. The space that is formed by removing the portion of the metal nitride layer and the high-k gate dielectric layer that is exposed by the hybrid space of the patterned and developed hybrid photoresist is hereafter referred to as the gate stack space 12. The gate stack space 12 typically has a width W2 that is equal to the width of the hybrid opening. For example, in one embodiment, the width W2 of the gate stack space 12 ranges from 25 nm to 60 nm. In another embodiment, the width W2 of the gate stack space 12 ranges from 30 nm to 55 nm. In yet another embodiment, the width W2 of the gate stack space 12 ranges from 45 nm to 50 nm. The geometry of the gate stack space 12 is typically the same as the geometry for the hybrid space 11 in the patterned and developed hybrid photoresist. In one example, the gate stack space 12 is present around the perimeter of at least one of the first conductivity device region 10 and the second conductivity device region 15, as depicted in FIG. 2A.

The term "anisotropic etch process" as used to describe the etch process for forming the gate stack space 12 denotes a material removal process in which the etch rate in the direction normal to the surface to be etched is higher than in the direction parallel to the surface to be etched. Examples of anisotropic etch processes that are suitable for forming the pillar openings include reactive-ion etching (RIE), ion beam etching, or plasma etching. Reactive ion etching (RIE) is a form of plasma etching in which during etching the surface to be etched is exposed to reactive gases in the presence of an RF field. During RIE the surface to be etched takes on a potential that accelerates the reactive species extracted from a plasma toward the surface, in which the chemical etching reaction is taking place in the direction normal to the surface.

The etch process for forming the gate stack space 12 may be a selective etch process. As used herein, the term "selective" in reference to a material removal process denotes that the rate of material removal for a first material is greater than the rate of removal for at least another material of the structure to which the material removal process is being applied. For example, a first material may be removed selectively to a second material by an etch rate ratio of 10:1. In another example, the first material may be removed selectively to the second material by an etch rate ratio of 100:1. In some embodiments, the etch chemistry for forming the gate stack space 12 may remove the material of the optional hardmask selectively to the patterned and developed hybrid photoresist and the metal nitride layer. In a following etch process, the exposed portion of the metal nitride layer and the underlying high-k gate dielectric may be etched selectively to the semiconductor substrate 5 or isolation region 6. In some embodiments, following formation of the gate stack space 12, the patterned and developed hybrid photoresist may be removed. The patterned and developed hybrid photoresist layer may be removed by a chemical strip method, oxygen ashing or selective etching. When present, the optional hardmask may also be removed.

Figure 4A:
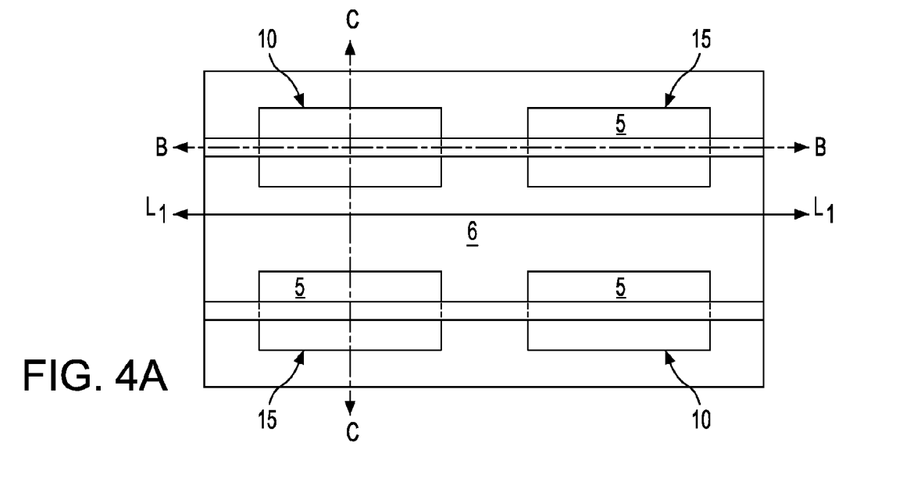
FIG. 4A is a top down planar view depicting forming a connecting gate conductor over the first portion and the second portion of the high-k gate dielectric layer, in accordance with one embodiment of the present disclosure.
Figure 4B:
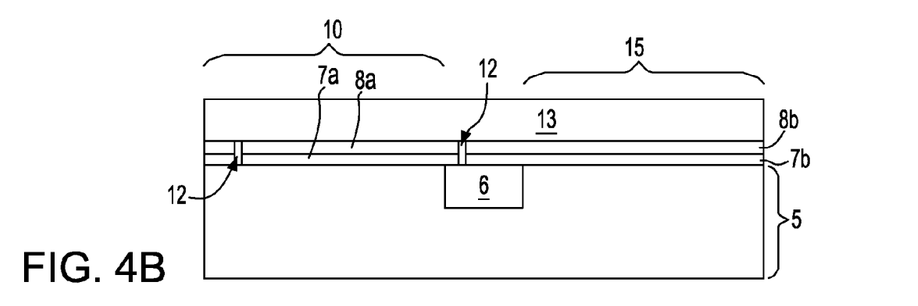
FIG. 4B is a side cross-sectional view along section line B-B in FIG. 4A.
Figure 4C:
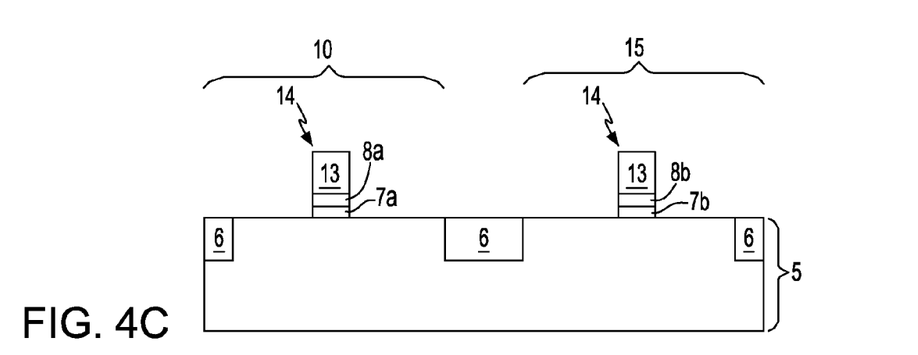
FIG. 4C is a side cross-sectional view along section line C-C in FIG. 4A.

FIGS. 4A-4C depict one embodiment of forming a connecting gate conductor 13 over the first portion and the second portion of the high-k gate dielectric layer 7a, 7b. In some embodiments, the connecting gate conductor 13 is formed over, e.g., in direct contact with, the first portion and the second portion of the metal nitride layer 8a, 8b. In one embodiment, the connecting gate conductor 13 is a single continuous material layer that extends from the first conductivity device region 10 across the isolation region 6 to the second conductivity device region 15. In one embodiment, the connecting gate conductor 13 may be composed of a silicon containing material. Examples of silicon containing materials suitable for the connecting gate conductor 13 include, but are not limited to, silicon, single crystal silicon, polycrystalline silicon, silicon germanium, and amorphous silicon. The connecting gate conductor 13 may have a thickness ranging from 2 nm to 10 nm. In another embodiment, connecting gate conductor 13 may have a thickness ranging from 2 nm to 5 nm. In one embodiment, the connecting gate conductor 13 is provided by a doped semiconductor, such as n-type doped polysilicon. Although the connecting gate conductor 13 is depicted as being a single material layer, that the connecting gate conductor 13 may be composed of any number of semiconductor or metal layers or alloys thereof having any number of compositions.

In one embodiment, the connecting gate conductor 13 is deposited and then doped by ion implantation. The material for the connecting gate conductor 13 may be deposited using chemical vapor deposition (CVD). Variations of CVD processes suitable for depositing the connecting gate conductor 13 include, but are not limited to, Atmospheric Pressure CVD (APCVD), Low Pressure CVD (LPCVD) and Plasma Enhanced CVD (EPCVD), Metal-Organic CVD (MOCVD) and others. The connecting gate conductor 13 may be doped using ion implantation following the deposition of the material for the connecting gate conductor 13. In another embodiment, the connecting gate conductor 13 may be in-situ doped as the material layer for the connecting gate conductor 13 is formed. In one embodiment, the connecting gate conductor 13 is composed of a silicon containing material that is doped with an n-type dopant to a concentration ranging from $5 \times 10^{18}$ $cm^{-3}$ to $5 \times 10^{20}$ $cm^{-3}$.

FIGS. 4A-4C also depict one embodiment of etching the blanket layer connecting gate conductor 13 and the underlying first and second portions of the metal nitride layer 8a, 8b and the underlying first and second portions of the high-k gate dielectric layer 7a, 7b to provide gate structures 14 spanning across the isolation region 6 from the first conductivity device region 10 to the second conductivity device region 15 of the semiconductor substrate 5. A "gate structure" means a structure used to control output current (i.e., flow of carriers in the channel, e.g., turn "on" or "off") of a semiconductor device through electrical or magnetic fields. In one embodiment, forming the gate structures 14 from the blanket layers of the connecting gate conductor 13, the first and second portions of the metal nitride layer 8a, 8b and the first and second portions of the high-k gate dielectric layer 7a, 7b include, photolithography and a selective etching process. Specifically, an etch mask composed of photoresist can be produced by applying a photoresist layer to the surface to be etched, exposing the photoresist layer to a pattern of radiation, and then developing the pattern into the photoresist utilizing a resist developer. Once the patterning of the photoresist is completed to form the etch mask, the sections covered by the etch mask are protected, while the exposed regions are removed using a selective etching process that removes the unprotected regions.

Following formation of the etch mask on the blanket layer connecting gate conductor 13, the exposed portions of the blanket layer connecting gate conductor 13, the first and second portions of the metal nitride layer 8a, 8b, and the first and second portions of the high-k gate dielectric layer 7a, 7b are etched to form the gate structures 14 and expose portions of the at least one first conductivity device region 10 and the second conductivity device region 15 in which the source regions and drain regions are to be formed. Examples of an anisotropic etch process suitable for forming the gate structures 14 include, but are not limited to, reactive-ion etching (RIE), ion beam etching, plasma etching and/or laser ablation. Referring to FIG. 4A, the gate structures 14 may have a length L1 that is perpendicular to the length of the first and second channel region in the first conductivity device region 10 and/or the second conductivity device region 15.

Figure 5A:
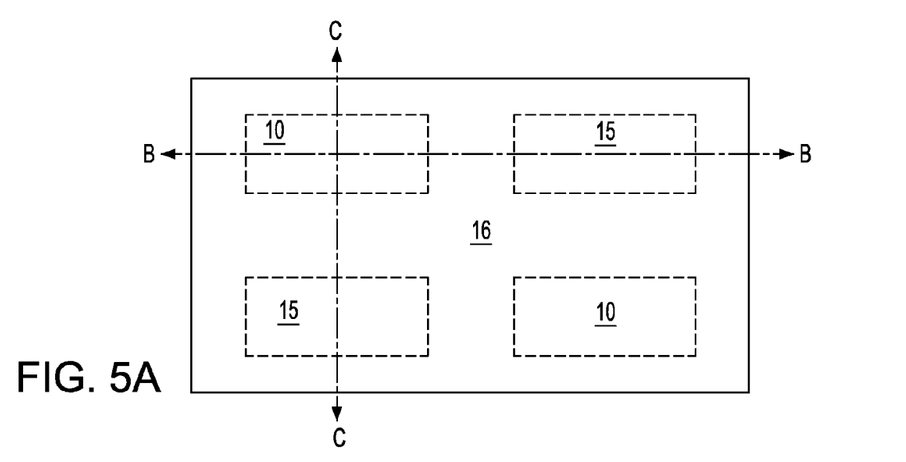
FIG. 5A is a top down planar view depicting one embodiment of forming a conformal dielectric layer over the first conductivity device region and the second conductivity device region, in accordance with of the present disclosure.
Figure 5B:
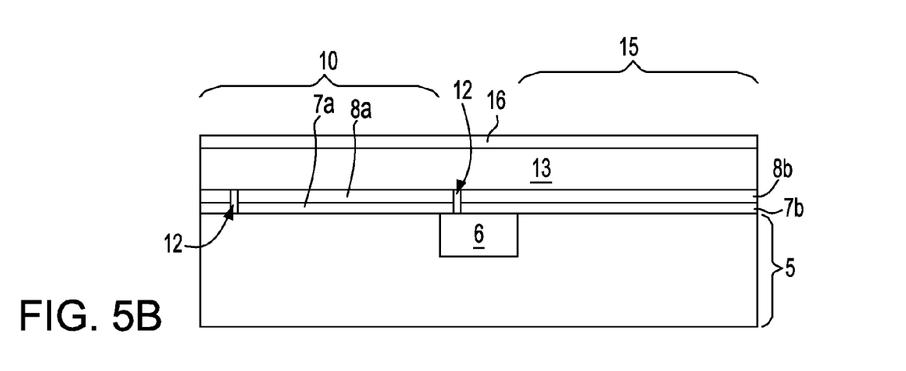
FIG. 5B is a side cross-sectional view along section line B-B in FIG. 5A.
Figure 5C:
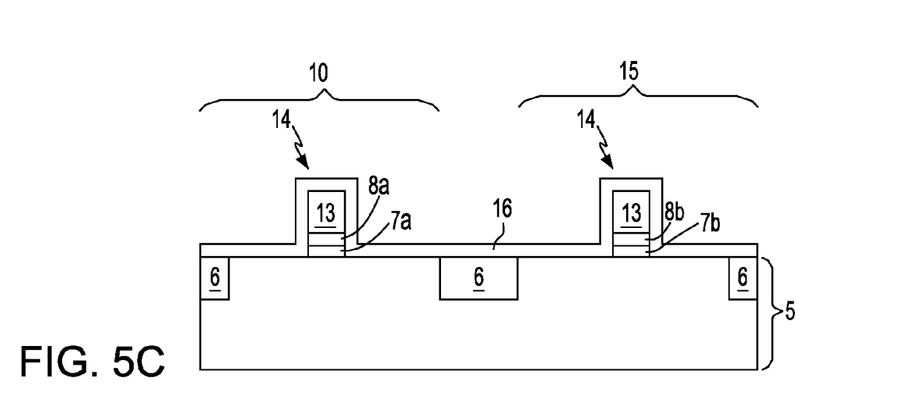
FIG. 5C is a side cross-sectional view along section line C-C in FIG. 5A.

FIGS. 5A-5B depict one embodiment of forming a conformal dielectric layer 16 over the first conductivity device region 10 and the second conductivity device region 15. The term "conformal" denotes a layer having a thickness that does not deviate from greater than or less than 20% of an average value for the thickness of the layer. The term "conformally deposited" denotes a deposition method that forms a conformal layer. The conformal dielectric layer 16 may be composed of any dielectric layer including, but not limited to oxides, nitrides, oxynitrides or combinations and multi-layers thereof. In one embodiment, the conformal dielectric layer 16 is composed of silicon nitride. In another embodiment, the conformal dielectric layer 16 is composed of silicon oxide. The conformal dielectric layer 16 may be formed by a deposition method including, but not limited to spinning from solution, spraying from solution, chemical vapor deposition (CVD), plasma enhanced CVD (PECVD), plasma oxidation, plasma nitridation, sputter deposition, reactive sputter deposition, ion-beam deposition, and evaporation. The conformal dielectric layer 16 can be deposited to a thickness generally in the range from 300 angstroms to 1500 angstroms. In another embodiment, the conformal dielectric layer 16 is deposited to a thickness ranging from 300 angstroms to 1500 angstroms. In one embodiment, the conformal dielectric layer 16 if formed on the upper surface of the semiconductor substrate 5, the upper surface of the gate structures 14, and the sidewall surfaces of the gate structures 14.

Figure 6A:
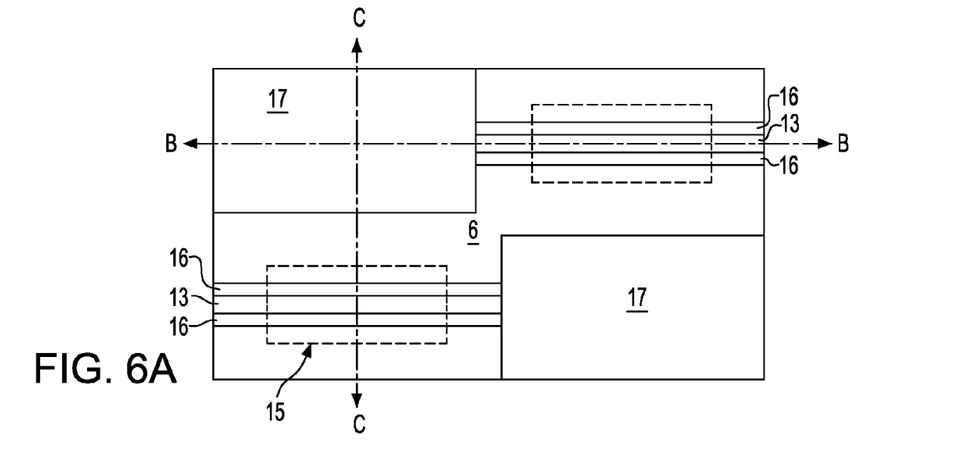
FIG. 6A is a top down planar view depicting forming a block mask on a first portion of the conformal dielectric layer over the first conductivity device region to be protected from exposure to an oxygen containing atmosphere and etching a second portion of the conformal dielectric layer that is not covered by the block mask to expose an upper surface of the semiconductor substrate in the second conductivity device region that is to be exposed to the oxygen containing atmosphere, and applying an oxygen containing atmosphere to the second conductivity device region, in accordance with one embodiment of the present disclosure.
Figure 6B:
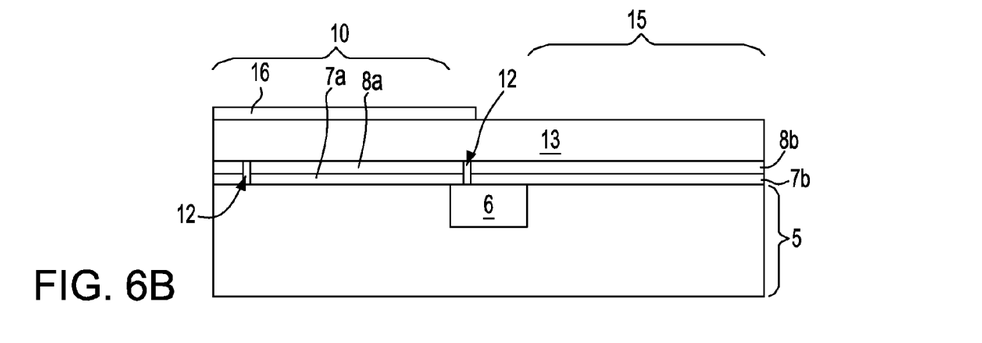
FIG. 6B is a side cross-sectional view along section line B-B in FIG. 6A.
Figure 6C:
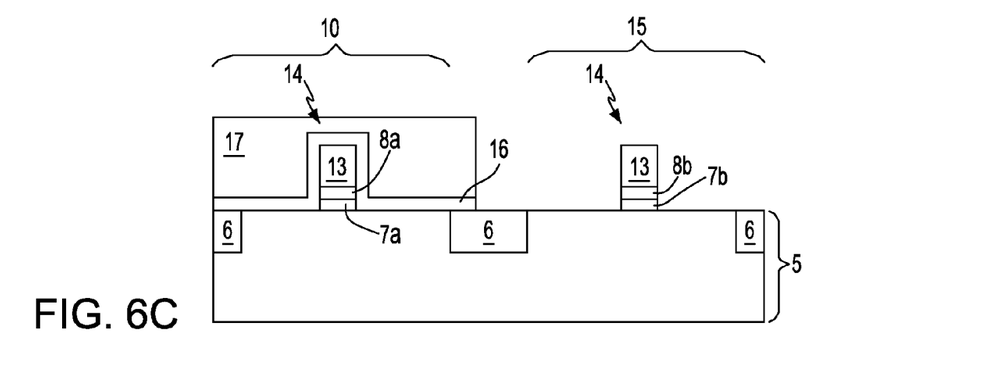
FIG. 6C is a side cross-sectional view along section line C-C in FIG. 6A.

FIGS. 6A-6C depict forming a block mask 17 on a first portion of the conformal dielectric layer 16 over the first conductivity device region 10 to be protected from a subsequent exposure to the semiconductor substrate 5 with an oxygen containing atmosphere, and etching a second portion of the conformal dielectric layer 16 that is not covered by the block mask 17 to expose a portion of the semiconductor substrate 5 in the second conductivity device region 15 to be exposed to the oxygen containing atmosphere. In one embodiment, the block mask 17 is composed a photoresist material. For example, a layer of photoresist material may be deposited atop the entire semiconductor substrate 5 including the first conductivity device region 10 and the second conductivity device region 15. The photoresist material can be composed of dielectrics including carbon, oxygen, and various inorganic materials. The photoresist layer may then be selectively exposed to light and developed to pattern a block mask 17, protecting at least one region, e.g., the first conductivity device region 10, of the semiconductor substrate 5 and exposing at least another region, e.g., second conductivity device region 15, of the semiconductor substrate 5.

The exposed regions of the semiconductor substrate 5 are then processed while the regions underlying the block mask 17 are protected. For example, in the embodiment depicted in FIGS. 6A-6C, following the formation of the block mask 17 protecting the first portion of the conformal dielectric layer 16 over the first conductivity device region 10, the second portion of the conformal dielectric layer 16 that is present in the second conductivity device region 15 is etched. In one embodiment, the etch process for etching the conformal dielectric layer 16 that is present in the second conductivity device region 15 is an anisotropic etch that removes the horizontal portions of the conformal dielectric layer 16 from the upper surface of the semiconductor substrate 5 and the upper surface of the gate structure 14 that are present in the second conductivity device region 15. Examples of anisotropic etch processes that are suitable for etching the conformal dielectric layer 16 that is present in the second conductivity device region 15 include reactive-ion etching (RIE), ion beam etching, or plasma etching. In some embodiments, the portions of the conformal dielectric layer 16 that are present on the sidewalls of the gate structure 14 in the second conductivity device region 15 may remain. The first portion of the conformal dielectric layer 16 that is present in the first conductivity device region 15 is protected by the block mask 17. After etching the portion of the conformal dielectric layer 16 that is present in the second conductivity device region 15, the block mask 17 may be removed. In some examples, the block mask 17 may be removed using chemical stripping or selective etching. Although FIGS. 6A-6C depict exposing the second conductivity device region 15 (e.g., the region of the substrate that is processed to provide a p-type conductivity semiconductor device) to an oxygen containing atmosphere, the present disclosure is not limited to only this example. For example, in some embodiments, the first conductivity device region 10 (e.g., the region of the semiconductor substrate that is processed to provide an n-type conductivity semiconductor device) may be exposed to the oxygen containing atmosphere, while the second conductivity device region 15 is protected, (which may contain p-type conductivity semiconductor devices).

FIGS. 6A-6C also depict applying an oxygen containing atmosphere to the second conductivity device region 15. In one embodiment, the oxygen containing atmosphere that is applied to exposed gate structure 14 of the first conductivity device region 10 may be provided by ambient air, an oxygen-containing precursor gas within a deposition chamber, an oxygen containing plasma or a combination thereof. In one embodiment, the oxygen content of the oxygen containing atmosphere may range from 1% to 99%. In another embodiment, the oxygen content of the oxygen containing atmosphere may range from 25% to 75%. In yet another embodiment, the oxygen content of the oxygen containing atmosphere may range from 35% to 50%. Exposure to oxygen containing ambient is performed preferably when the wafers are held at a temperature higher than room temperature, e.g., 20° C. to 25° C. In one embodiment, exposure to oxygen containing ambient is performed when the wafers are at a temperature ranging from 300° C. to 200° C.

Figure 7:
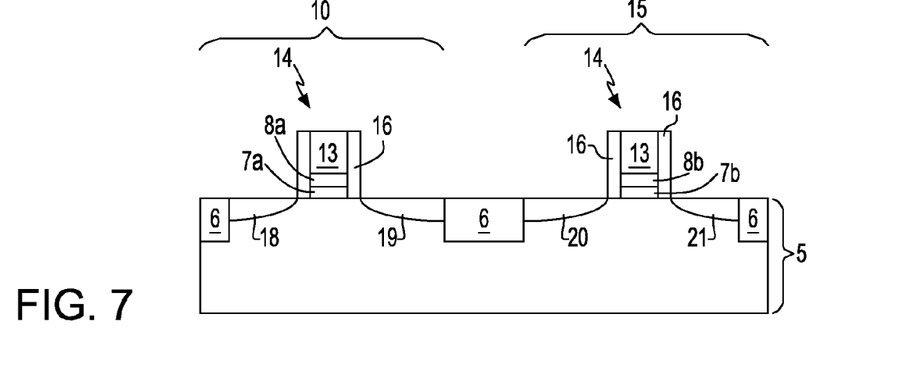
FIG. 7 depicts forming source regions and drain regions in the structure depicted in FIGS. 6A-6C, in accordance with one embodiment of the present disclosure.

FIG. 7 depicts one embodiment of forming the source and drain regions 18, 19, 20, 21 of the semiconductor devices that are present within the first conductivity device region 10 and the second conductivity device region 15. In one embodiment, prior to forming the source and drain regions 18, 19, 20, 21, the remaining portion of the conformal dielectric layer 16 may be removed from at least the horizontal surfaces of the semiconductor substrate 5 in the first conductivity device region 10. In one embodiment, the remaining portion of the conformal dielectric layer 16 may be etched with an anisotropic etch. As used herein, the term "source" is a doped region in the semiconductor device, in which majority carriers are flowing into the channel region that is underlying the gate structure 14. As used herein, the term "drain" means a doped region in semiconductor device located at the end of the channel, in which carriers are flowing out of the semiconductor device through the drain. In one embodiment, the source region 18 and the drain region 19 that are present in the first conductivity device region 10 may be doped to an n-type conductivity, and the source region 20 and the drain region 21 that are present in the second conductivity device region 15 may be doped to a p-type conductivity. As used herein, "p-type" refers to the addition of impurities to an intrinsic semiconductor that creates deficiencies of valence electrons. In a silicon containing semiconductor substrate 5, examples of p-type dopants, i.e., impurities, include but are not limited to boron, aluminum, gallium and indium. As used herein, "n-type" refers to the addition of impurities that contributes free electrons to an intrinsic semiconductor. In a silicon containing semiconductor substrate 5 examples of n-type dopants, i.e., impurities, include but are not limited to, antimony, arsenic and phosphorous. The dopant for the source regions 18, 20 and the drain regions 19, 21 may be introduced via ion implantation. Although not depicted in the supplied figures, raised source and drain regions may also be employed with the teachings of the present disclosure.

The high-k dielectric material of the gate structures 14 can absorb and conduct oxygen. When the oxygen that is supplied by the oxygen containing atmosphere comes into contact with the high-k gate dielectric of a p-type semiconductor device it can shift the p-type semiconductor device's threshold voltage to a lower value than the threshold voltage of the p-type semiconductor device prior to being exposed to oxygen. When the oxygen that is supplied by the oxygen containing atmosphere comes into contact with the high-k gate dielectric of a n-type semiconductor device it can shift the n-type semiconductor device's threshold voltage to a higher value than the threshold voltage of the n-type semiconductor device prior to being exposed to oxygen. In one embodiment, the methods and structures disclosed herein form a gate stack space 12 between the first portion of the high-k gate dielectric layer 7a that is present in the first conductivity device region 10, e.g., region of the semiconductor substrate 5 including n-type semiconductor devices, and the second portion of the high-k gate dielectric layer 7b that is present in the second conductivity device region 15, e.g., region of the semiconductor substrate 5 including p-type semiconductor devices. The gate stack space 12 obstructs oxygen from traveling from one of the first and second conductivity device regions 10, 15 to the other of the first and second conductivity device regions 10, 15 through the gate structures that are typically shared by the first and second conductivity device regions 10, 15. In some embodiments, by separating, i.e., isolating, the first portion of the high-k gate dielectric layer 7a from the second portion of the high-k gate dielectric layer 7b, the methods and structures disclosed herein provide for modification of the threshold voltage of the semiconductor devices contained within the first conductivity device region 10 (or second conductivity device region 15) by exposure to oxygen without impacting the threshold voltage of the semiconductor devices that are contained in the second conductivity device region 15 (or first conductivity device region 10).

For example, when the semiconductor devices that are present in the second conductivity device region 15 are p-type semiconductor devices, such as pFETs, and are exposed to the oxygen containing atmosphere, the p-type semiconductor devices can experience a shift in threshold voltage that may range from −80 mV to −300 mV while the n-type semiconductor devices, such as nFETs, that are present in the first conductivity device region 10 that are isolated from the oxygen containing atmosphere by the gate stack space 12 do not experience a threshold voltage shift. In this example, the threshold voltage of the p-type semiconductor devices in the second conductivity device region 15 may range from 150 mV to 500 mV and the threshold voltage of the n-type semiconductor devices in the first conductivity device region 10 may range from 150 mV to 500 mV. In another example, when the semiconductor devices that are present in the second conductivity device region 15 are n-type semiconductor devices, such as nFETs, and are exposed to the oxygen containing atmosphere, the n-type semiconductor devices can experience a shift in threshold voltage that may range from 80 mV to 300 mV, while the p-type semiconductor devices, such as pFETs, that are present in the first conductivity device region 10 that are isolated from the oxygen containing atmosphere by the gate stack space 12 do not experience a threshold voltage shift. In this example, the threshold voltage of the n-type semiconductor devices in the second conductivity device region 15 may range from 250 mV to 600 mV and the threshold voltage of the p-type semiconductor devices in the first conductivity device region 10 may range 250 mV to 600 mV.

In the process flow that is depicted in FIGS. 1-7, the gate structures 14 are formed using a "gate first process". In a gate first process, the functional gate structure is formed prior to the source regions 18, 20 and drain regions 19, 21, and remains in the final structure of the semiconductor device. Although not depicted in the figures, the methods and structures disclosed herein are equally applicable to a "gate last process", in which a sacrificial gate structure is formed prior to the source and drain region, and is replaced with a functional gate structure after forming the source and drain regions, e.g., annealing the source and drain regions. In the gate last process, the sacrificial gate structure dictates the geometry of the later from functional gate structure. In some embodiments, prior to forming the source and drain regions a sacrificial gate structure may be substituted for the metal nitride and the connecting gate conductor of the process flow that is described above with reference to FIGS. 1-7. After forming the source and drain regions, the sacrificial gate structure may be replaced with the first and second portion of the metal nitride layer 8a, 8b and the connected gate conductor 13 to provide a functional gate structure in a gate last process flow.

FIG. 8A-10 depict one embodiment of forming a finFET semiconductor device, in which the work function of at least one of the finFET semiconductor devices is adjusted by exposure to an oxygen containing atmosphere and at least one of the finFET semiconductor devices are protected from being exposed to an oxygen containing atmosphere. A finFET semiconductor device is a field effect transistor, in which the body of the field effect transistor that contains the channel is present in a fin structure. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

Figure 8A:
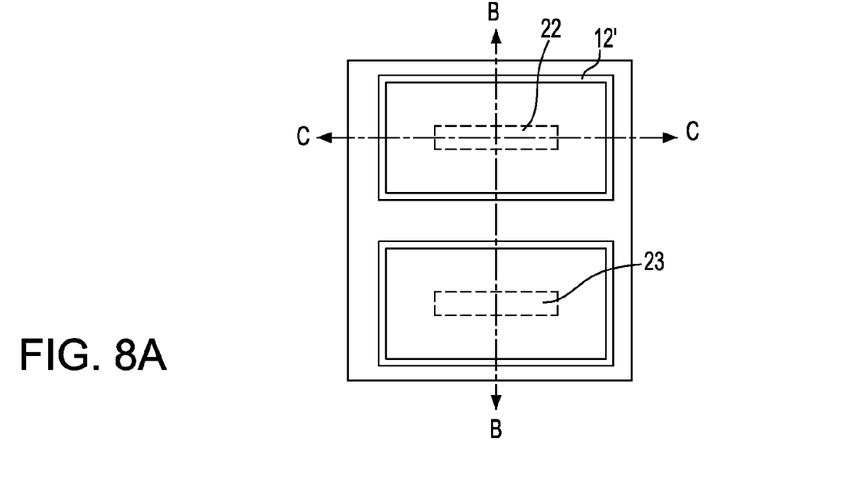
FIG. 8A is a top down planar view depicting patterning a high-k gate dielectric layer and the metal nitride layer to separate a first portion of a high-k gate dielectric layer and the metal nitride layer that is present on a first fin structure from a second portion of the high-k gate dielectric layer and the metal nitride layer that is present on a second fin structure for one embodiment of a method of forming electrical devices including finFET semiconductor devices in accordance with the present disclosure.
Figure 8B:
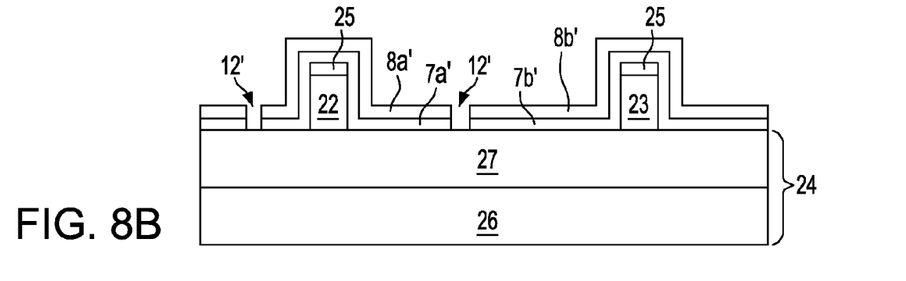
FIG. 8B is a side cross-sectional view along section line B-B in FIG. 8A.

FIGS. 8A and 8B depict one embodiment of forming fin structures 22, 23 on a substrate 24. In one embodiment, a dielectric fin cap 25 may be optionally present on the upper surface of each of the fin structures 22, 23. In one embodiment, the fin structures 22, 23 and the upper surface of the substrate 24 may be formed from an SOI substrate, in which the top semiconductor layer of the SOI substrate provides the fin structures 22, 23. In one embodiment, the SOI substrate typically includes a bottom semiconductor layer 26 and a top semiconductor layer (which provides the fin structures 22, 23) that are electrically isolated from each other by a buried insulating layer 27. The top semiconductor layer (which provides the fin structures 22, 23) and the bottom semiconductor layer 2C may comprise at least one of Si, Ge alloys, SiGe, GaAs, InAs, InP, SiCGe, SiC as well as other III/V or II/VI compound semiconductors. In one embodiment, prior to etching the SOI substrate to provide the fin structures 22, 23, a layer of the dielectric material that provides the dielectric fin cap 25 is deposited atop the SOI substrate. The dielectric fin cap 25 may be composed of a nitride, oxide, oxynitride material, and/or any other suitable dielectric layer. In one embodiment, following the formation of the layer of dielectric material that provides the dielectric fin cap 25, a photolithography and etch process sequence applied to the dielectric fin cap 25 and the SOI substrate 24 may provide the fin structures 22, 23 that are depicted in FIGS. 8A and 8B. Each of the fin structures 22, 23 may have a height $H_1$ ranging from 5 nm to 200 nm. In another embodiment, teach of the fin structures 22, 23 has a height $H_1$ ranging from 10 nm to 100 nm. Each of the fin structures 22, 23 may have a width $W_2$ of less than 20 nm. In another embodiment, each of the fin structures 22, 23 may have a width $W_2$ ranging from 3 nm to 10 nm.

FIGS. 8A and 8B also depict one embodiment of depositing a high-k gate dielectric layer 7a', 7b' and the metal nitride layer 8a', 8b' on the fin structures 22, 23 and the upper surface of the substrate 24 that is separating the fin structures 22, 23. In one embodiment, each of the high-k gate dielectric layer 7a', 7b' and the metal nitride layer 8a', 8b' is a conformally deposited material layer that is present on the sidewalls and upper surface of the fin structures 22, 23. The high-k gate dielectric layer 7a', 7b' and the metal nitride layer 8a', 8b' that are depicted in FIGS. 8A and 8B are similar to the high-k gate dielectric layer 7 and the metal nitride layer 8 that are described above with reference to FIG. 1. Therefore, the description of the metal nitride layer 8 and the high-k gate dielectric layer 7 that is depicted in FIG. 1 is suitable for the high-k gate dielectric layer 7a', 7b' and the metal nitride layer 8a', 8b' that are depicted in FIGS. 8A and 8B.

FIGS. 8A and 8B further depict one embodiment of patterning the high-k gate dielectric layer and the metal nitride layer to separate a first portion of the high-k gate dielectric layer 7a' and the metal nitride layer 8a' that is present on the first fin structure 22 from a second portion of the high-k gate dielectric layer 7b' and the metal nitride layer 8b' that is present on the second fin structure 23. In one embodiment, the patterning of the high-k gate dielectric layer to separate the first portion of the high-k gate dielectric layer 7a and a first portion of the metal nitride layer 8a that is present on the first fin structure 22 from a second portion of the high-k gate dielectric layer 7b and a second portion of the metal nitride layer 8b that is present on the second fin structure 23 includes anisotropic etching and a combination of a hybrid photoresist layer and one of a positive or negative mask. The opening that is formed by removing the high-k gate dielectric layer and the metal nitride layer to separate the first portion of the high-k gate dielectric layer 7a and the first portion of the metal nitride layer 8a that is present on the first fin structure 22 from the second portion of the high-k gate dielectric layer 7b and the second portion of the metal nitride layer 8b may be referred to as a gate stack opening 12'. The patterning the high-k gate dielectric layer and the metal nitride layer that is depicted in FIGS. 8A and 8B is similar to the patterning of the high-k gate dielectric layer and the metal nitride layer that is described above with reference to FIGS. 2A, 2B and 3. Therefore, the process for patterning the high-k gate dielectric layer and the metal nitride layer that is describe above with reference to FIGS. 2A, 2B and 3 is suitable for patterning the high-k gate dielectric layer and the metal nitride layer that is depicted in FIGS. 8A and 8B.

Figure 9A:
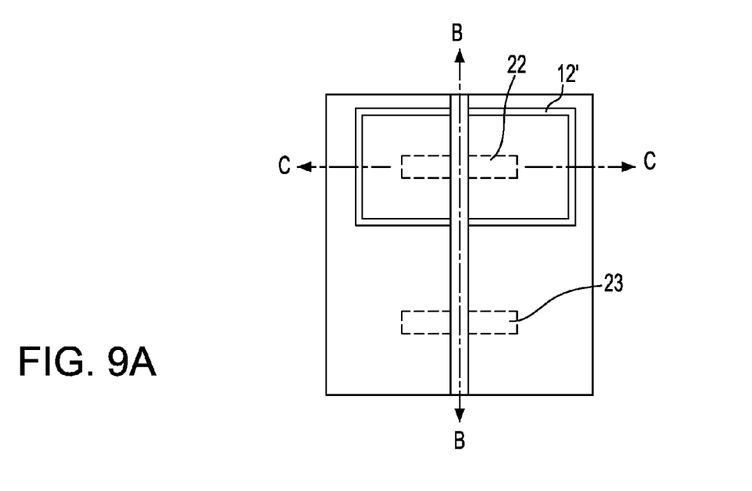
FIG. 9A is a top down planar view depicting forming a connecting gate conductor over the first portion of the high-k gate dielectric layer that is present on the first fin structure and the second portion of the high-k gate dielectric layer that is present on the second fin structure, in accordance with one embodiment of the present disclosure.
Figure 9B:
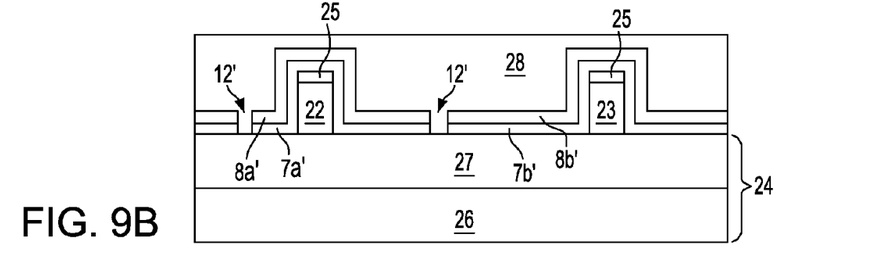
FIG. 9B is a side cross-sectional view along section line B-B in FIG. 9A.

FIGS. 9A and 9B depict forming a connecting gate conductor 28 over the first portion of the high-k gate dielectric layer 7a' that is present on the first fin structure 22 and the second portion of the high-k gate dielectric layer 7b' that is present on the second fin structure 23. The connecting gate conductor 28 that is depicted in FIGS. 9A and 9B is similar to the connecting gate conductor 13 that is described above with reference to FIG. 4A-4C. Therefore, the description of the connecting gate conductor 13 that is depicted in FIG. 4A-4C is suitable for the connecting gate conductor 28 that is depicted in FIGS. 9A and 9B.

Figure 10:
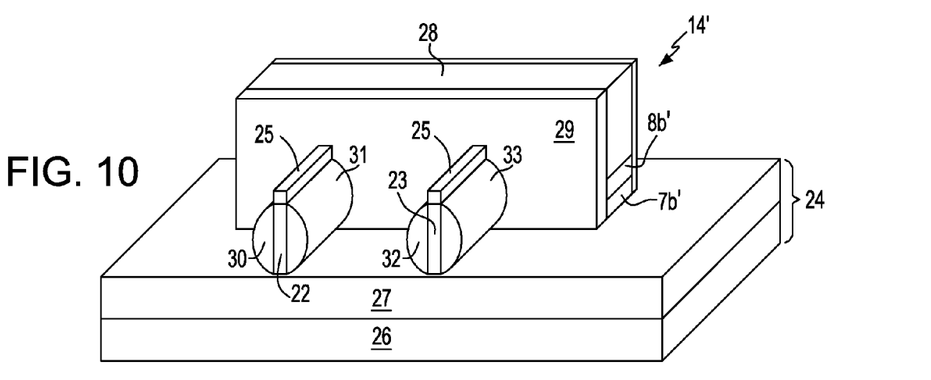
FIG. 10 is a perspective view of a finFET semiconductor device formed from the structure depicted in FIGS. 9A and 9B, in accordance with one embodiment of the present disclosure.

The material layer for the connecting gate conductor 28, the first portion of the high-k gate dielectric layer 7a', the second portion of the high-k gate dielectric layer 7b', the first portion of the metal nitride layer 8a' and the second portion of the metal nitride layer 8b' may than be patterned and etched to provide a gate structure 14', as depicted in FIG. 10. The connecting gate conductor 28 of the gate structure 29' extends from the first fin structure 22 to the second fin structure 23.

Following formation of the gate structure 14', one of the first fin structure 22 or the second fin structure 23 is exposed to an oxygen containing atmosphere, while the other of the first fin structure 22 or the second fin structure 23 is protected from being exposed to the oxygen containing atmosphere. In one embodiment, to protect one of the first fin structure 22 or the second fin structure 23 from the oxygen-containing atmosphere, a conformal dielectric layer is formed over the fin structure, e.g., first or second fin structure 22, 23, that is to be protected. The fin structure, e.g., first or second fin structure 22, 23, that is to be exposed to the oxygen containing atmosphere is not covered with the conformal dielectric layer. The conformal dielectric layer and its use to protect one of the fin structures from being exposed to the oxygen containing atmosphere is similar to the conformal dielectric layer 16 that is described above with reference to FIGS. 5A-6C for protecting one of the first conductivity device region 10 and the second conductivity device region 15 from being exposed to the oxygen containing atmosphere. The oxygen containing atmosphere that is applied to the exposed fin structure, e.g., first or second fin structure 22, 23, has also been described above with reference to FIGS. 6A-6C.

FIG. 10 depicts forming a spacer 29 in direct contact with the gate structure 14'. The spacer 29 may be formed by depositing a conformal layer of dielectric material, such as oxides, nitrides or oxynitrides. In one embodiment, the etching process is an anisotropic etching process, such as reactive ion etch. The first spacer 29 may have a width ranging from 1 nm to 10 nm, typically ranging from 1 nm to 5 nm. Following the formation of the spacer 29, source regions 30, 32 and drain regions 31, 33 may be formed on the exposed sidewall surfaces of the first fin structure 22 and the second fin structure 23. In one embodiment, the source and drain regions 30, 31, 32, 33 are formed on the first and second fin structures 22, 23 using an in-situ doped epitaxially formed semiconductor material. A number of different sources may be used for the deposition of epitaxial silicon. Silicon sources for epitaxial growth include silicon tetrachloride, dichlorosilane ($SiH_2Cl_2$), and silane ($SiH_4$). In one embodiment, the in-situ doped epitaxially formed semiconductor material may be provided by selective-epitaxial growth of SiGe on the exposed sidewalls of the first and second fin structures 22, 23. In another embodiment, the in-situ doped epitaxially formed semiconductor material 210 is composed of Si:C or carbon doped silicon.

P-type finFET devices are produced by doping the in-situ doped epitaxially formed semiconductor material with elements from group III of the Periodic Table of Elements. In one embodiment, the group III element is boron, aluminum, gallium or indium. N-type finFET devices are produced by doping the in-situ doped epitaxially formed semiconductor material with elements from group V of the Periodic Table of Elements. In one embodiment, the group V element is phosphorus, antimony or arsenic. In one embodiment, the in-situ doped semiconductor material that is present on the sidewalls of the first fin structure 22 is doped with a first conductivity type dopant, e.g., n-type dopant, and the in situ doped semiconductor material that is present on the sidewalls of the second fin structure 23 is doped with a second conductivity type dopant, e.g., p-type dopant. In one embodiment, the dopant from the in-situ doped epitaxial semiconductor material that provides the source regions 30, 31 and the drain regions 32, 33 may be diffused into the first and second fin structures 22, 23 to form extension regions. In one embodiment, the dopant from the in-situ doped epitaxially formed semiconductor material is diffused into the fin structures 22, 23 by an annealing processes including, but not limited to, rapid thermal annealing, furnace annealing, flash lamp annealing or laser annealing.

The high-k dielectric material of the gate structures 14' can absorb and conduct oxygen. When the oxygen that is supplied by the oxygen containing atmosphere comes into contact with the high-k gate dielectric of the p-type finFET device it can shift the p-type finFET's threshold voltage to a lower value than the threshold voltage of the p-type finFET prior to being exposed to oxygen. When the oxygen that is supplied by the oxygen containing atmosphere comes into contact with the high-k gate dielectric of the n-type finFET it can shift the n-type finFET's threshold voltage to a higher value than the threshold voltage of the n-type finFET prior to being exposed to oxygen. In one embodiment, the methods and structures disclosed herein form a gate stack space 12' between the first portion of the high-k gate dielectric layer 7a' that is present in contact with the first fin structure 22, e.g., fin structure of the n-type finFET, and the second portion of the high-k gate dielectric 7b' that is present in contact with the second fin structure 23, e.g., fin structure of the p-type finFET. The gate stack space 12' obstructs oxygen from traveling from one of the first and second fin structures 22, 23 to the other of the first and second fin structures 22, 23 through the gate structures that are typically shared by the first and second fin structures 22, 23. In some embodiments, by separating, i.e., isolating, the first portion of the high-k gate dielectric layer 7a' from the second portion of the high-k gate dielectric layer 7b', the methods and structures disclosed herein provide for modification of the threshold voltage of the finFET provided by the first fin structure 22 (or second fin structure 23) by exposure to oxygen without impacting the threshold voltage of the finFET provided by the second fin structure 23 (or first fin structure 22).

For example, when the semiconductor devices that are present in the second fin structure 23 is processed to provide a p-type finFET, and the second fin structure 12 is exposed to the oxygen containing atmosphere, the p-type finFET can experience a shift in threshold voltage that may range from −80 mV to −300 mV while the n-type finFET that is formed from the first fin structure 22 and is isolated from the oxygen containing atmosphere by the gate stack space 12' does not experience a threshold voltage shift. In this example, the threshold voltage of the p-type finFET may range from 150 mV to 500 mV and the threshold voltage of the n-type finFET may range from 150 mV to 500 mV. In another example, when the second fin structure 23 is processed to provide an n-type finFET, and the second fin structure 23 is exposed to the oxygen containing atmosphere, the n-type finFET can experience a shift in threshold voltage that may range from 80 mV to 300 mV, while the p-type finFET that is formed from the first fin structure 22 and is isolated from the oxygen containing atmosphere by the gate stack space 12' does not experience a threshold voltage shift. In this example, the threshold voltage of the n-type finFET in the second conductivity device region 15 may range from 250 mV to 600 mV and the threshold voltage of the p-type finFET in the first conductivity device region 10 may range from 250 mV to 600 mV.

In the process flow that is depicted in FIGS. 8A-10, the gate structures 14' are formed using a "gate first process". Although not depicted in the figures, the methods and structures disclosed herein are equally applicable to a "gate last process", in which a sacrificial gate structure is formed prior to the source and drain region, and is replaced with a functional gate structure after forming the source and drain regions, e.g., annealing the source and drain regions. In the gate last process, the sacrificial gate structure dictates the geometry of the later from functional gate structure. In some embodiments, prior to forming the source and drain regions a sacrificial gate structure may be substituted for the metal nitride and the connecting gate conductor of the process flow that is described above with reference to FIGS. 8A-10. After forming the source and drain regions, the sacrificial gate structure may be replaced with the first and second portion of the metal nitride layer and the connected gate conductor to provide a functional gate structure in a gate last process flow.

While the present disclosure has been particularly shown and described with respect to preferred embodiments thereof, it will be understood by those skilled in the art that the foregoing and other changes in forms and details may be made without departing from the scope and spirit of the present disclosure. It is therefore intended that the present disclosure not be limited to the exact forms and details described and illustrated, but fall within the scope of the appended claims.

What is claimed is:

1. An electrical device comprising:
    a semiconductor substrate including a first device region and a second device region separated by an isolation region;
    a first gate stack in the first device region comprised of at least a first portion of a high-k gate dielectric layer and a first portion of a metal nitride layer atop the first portion of the high-k gate dielectric layer, wherein a first source region and a first drain region are present in the first device region on opposing sides of the first gate stack, wherein the first gate stack extends from the first device region onto the isolation region;
    a second gate stack in the second device region comprised of at least a second portion of the high-k gate dielectric layer and a second portion of the metal nitride layer atop the second portion of the high-k gate dielectric layer, wherein a second source region and a second drain region are present in the second device region on opposing sides of the second gate stack, and wherein the second gate stack extends from the second device region onto the isolation region, and is separated from the first gate stack by a gate stack space, the gate stack space extending through the metal nitride layer and the high-k gate dielectric layer to the upper surface of the isolation region; and
    a connecting gate layer extending from the first gate stack across the gate stack space to the second gate stack, wherein the connecting gate layer is a single continuous material layer present in direct contact with upper surfaces of the first portion of the metal nitride layer and the second portion of the metal nitride layer, and the gate stack space.

2. The electrical device of claim 1, wherein the metal nitride layer comprises TiN, TaN, TiAlN, TaAlN, W, WN or a combination thereof.

3. The electrical device of claim 1, wherein the high-k gate dielectric layer is comprised of a hafnium containing material.

4. The electrical device of claim 1, wherein the connecting gate layer is comprised of a semiconductor containing conductive material or a silicide.

5. The electrical device of claim 1, wherein the gate stack space between ends of the first gate stack and the second gate stack ranges from 5 nm to 200 nm.

6. The electrical device of claim 1, wherein the gate stack space is present around a perimeter of at least one of the first device region and the second device region.

7. The electrical device of claim 1, wherein the second portion of the high-k gate dielectric layer interacts with oxygen so as to shift a threshold voltage of a semiconductor device formed in the second device region.

8. The electrical device of claim 7, wherein the threshold voltage of the semiconductor device formed in the second device region is shifted at least +/−80 mV.

9. The electrical device of claim 8, wherein the first device region is a n-type device region and the second device region is a p-type device region.

10. The electrical device of claim 8, wherein the first device region is a p-type device region and the second device region is a n-type device region.

* * * * *